United States Patent
Chapman et al.

(10) Patent No.: US 7,313,041 B1
(45) Date of Patent: Dec. 25, 2007

(54) SENSE AMPLIFIER CIRCUIT AND METHOD

(75) Inventors: David Chapman, Shelburne, VT (US);
Richard Parent, Shelburne, VT (US)

(73) Assignee: Cypress Semiconductor Corporation, San Jose, CA (US)

(*) Notice: Subject to any disclaimer, the term of this patent is extended or adjusted under 35 U.S.C. 154(b) by 188 days.

(21) Appl. No.: 10/870,289

(22) Filed: Jun. 16, 2004

Related U.S. Application Data

(60) Provisional application No. 60/480,763, filed on Jun. 23, 2003.

(51) Int. Cl.
*G11C 7/02* (2006.01)

(52) U.S. Cl. .................. 365/207; 365/196

(58) Field of Classification Search ............. 365/207, 365/196
See application file for complete search history.

(56) References Cited

U.S. PATENT DOCUMENTS

| | | | |
|---|---|---|---|
| 4,397,003 A | | 8/1983 | Wilson et al. |
| 4,669,063 A | * | 5/1987 | Kirsch ................ 365/149 |
| 5,029,137 A | * | 7/1991 | Hoshi ................ 365/208 |
| 5,148,399 A | * | 9/1992 | Cho et al. ............ 365/205 |
| 5,175,450 A | * | 12/1992 | Chern ................ 365/203 |
| 5,327,379 A | * | 7/1994 | Pascucci ............. 365/190 |
| 5,701,268 A | | 12/1997 | Lee et al. |
| 6,052,324 A | * | 4/2000 | Tobita ................ 365/207 |
| 6,115,309 A | * | 9/2000 | Coleman, Jr. ......... 365/208 |
| 6,314,028 B1 | * | 11/2001 | Kono ................ 365/189.09 |
| 6,430,095 B1 | * | 8/2002 | Casper ............... 365/201 |
| 6,449,202 B1 | * | 9/2002 | Akatsu et al. ........ 365/205 |
| 6,501,696 B1 | | 12/2002 | Mnich et al. |
| 6,829,171 B2 | * | 12/2004 | Ooishi ............... 365/185.21 |
| 2003/0185043 A1 | * | 10/2003 | Masuda .............. 365/154 |

* cited by examiner

*Primary Examiner*—Thong Q. Le
(74) *Attorney, Agent, or Firm*—Haverstock & Owens LLP

(57) ABSTRACT

A semiconductor device memory device (300) can include a sense amplifier (302) enabled according to a first sense signal (setn) and a second sense signal (setp). In a sense operation, a first sense signal (setn) can be driven to a first, below ground potential. Subsequently, in the same sense operation, the first sense signal (setn) can be raised and maintained at a ground potential. Such an approach can substantially eliminate a sense amplifier stall condition that can occur under low temperature and/or low voltage operation. According to another aspect of the embodiments, a more negative logical "0" value can be written back into the memory cell during an access and/or refresh operation. This more negative value is available due to the below ground level provided during a sense operation.

18 Claims, 3 Drawing Sheets

US 7,313,041 B1

SENSE AMPLIFIER CIRCUIT AND METHOD

This application claims the benefit of U.S. Provisional Patent Application Ser. No. 60/480,763 filed on Jun. 23, 2003.

TECHNICAL FIELD

The present invention relates generally to integrated circuits and more particularly to sense amplifier circuits in memory devices.

BACKGROUND OF THE INVENTION

Semiconductor memory devices typically include sense amplifier circuits for amplifying weak data signals from selected memory cells accessed in a read and/or write operation. In addition, sense amplifiers can also "refresh" data values by refreshing memory cell storage capacitor states in the case of memory devices that include dynamic memory cells, such as dynamic random access memories (DRAMs) and/or some types of pseudo static RAMs (PSRAMs).

An increasingly important feature of many DRAMs or other memory products, such as a one transistor (1-T) PSRAMs (one transistor used as a storage element where the product as a whole emulates a static type RAM), can be the ability to operate in low power and/or low voltage environments, such as those of battery powered systems.

As an operating voltage is decreased, the power consumed by a memory chip can also decrease. However, lowering the operating voltage of a 1T PSRAM, for example, can have drawbacks as the lower operating voltage approaches the threshold voltage (Vt) of transistors (e.g., MOSFETs) on the device. For example, the operation of the 1T PSRAM sense amplifier in a low voltage environment, specifically at colder temperatures, can result in higher operating transistor Vts. Such a higher Vts can cause sensing operation "stalls". Such sensing operation stalls can result in access and/or functional fails.

To better understand various aspects of the disclosed embodiments, a conventional memory device will now be described with reference to FIGS. 6 and 7. FIG. 6 is a schematic diagram of a conventional DRAM sense amplifier arrangement. FIG. 7 is a waveform showing the operation of the sense amplifier arrangement of FIG. 6.

The conventional circuit of FIG. 6 is designated by the general reference character 600 and shows a sense amplifier shared between adjacent array blocks. For example, a sense amplifier may be shared between an active array block and an inactive array block. The conventional sense amplifier arrangement includes a sense amplifier 602, an equalization circuit 604, a first access circuit 606, a second access circuit 608, and a first array block 610. It is understood that a second array block (not shown) could be connected to second access circuit 608.

A sensing operation will now be described with reference to FIG. 6 in conjunction with FIG. 7. For purposes of this discussion it will be assumed that memory cell 612-1 within first array block 610 is being accessed in a read operation.

Prior to memory cell 612-1 being accessed, bitline pair (BLt<0> and BLc<0>) can be precharged to about ½ of a bitline high voltage (e.g., to a regulated level "vbleq"). This is shown in FIG. 7 by bitlines Blt and Blc being at the equalization voltage vbleq.

During a sense operation, a word line (e.g., WL<1>) can be driven high. As a result, a transistor M1 within memory cell 612-1 can be turned on, transferring charge from the corresponding storage capacitor C1, to a bitline (BLc<0>). More particularly, when word line WL<0> goes high, by operation of transistor M1, capacitor C1 "charge shares" with BLc<0>. Thus, charge on the active bitline (in this case BLc<0>) is shared with the stored cell charge (in this case, charge on capacitor C1). As a result, the potential on the active bitline can change.

At the same time, the other bitline in the pair (in this case bit line BLt<0>), known as the "reference" bitline, can maintain a precharge state of about ½ the bitline high voltage level (e.g., vbleq). In this way, an initial differential voltage can develop between the bitline pair (e.g., the bitlines can "split"). This is shown in FIG. 7 by waveform BLc falling below the equalization voltage vbleq, while waveform Blt remains at the equalization voltage vbleq.

Of course, when a memory cell of an adjacent column is accessed, bitline BLt<0> will be the active bit line, while bitline BLc<0> will be the reference bitline.

Once a sufficient differential bitline voltage has been established, the sense amplifier 602 can be set or enabled. When sense amplifier 602 is set, the differential voltage of the bitline pair, known as the "signal," can be amplified and latched. In this way, a data value can be read from a memory cell.

In the conventional sense amplifier arrangement illustrated by FIGS. 6 and 7, the sense amplifier 602 can be "set" or enabled by driving of sources of cross-coupled transistors within the sense amplifier 602. More particularly, sense amplifier 602 can include cross-coupled n-channel (e.g., NMOS) transistors N1 and N2, and cross-coupled p-channel (e.g., PMOS) transistors P1 and P2. Transistors N1 and N2 may have commonly connected sources that receive a signal "setn". In a similar fashion, transistors P1 and P2 may have commonly connected sources that receive a signal "setp".

Prior to sense amplifier 602 being set, set signals (setn and setp), can be precharged at, or about, the equalization voltage vbleq. In a set operation (i.e., during a sense amplifier enable period), set signal setn can be driven to ground while set signal setp can be driven to a bitline high voltage. This is shown in detail in the waveforms of FIG. 7.

It is noted that in the case of read and/or refresh operation, a sense amplifier 602 can also "writeback" the sensed logic level, thereby enabling the storage capacitor to retain the stored data value. That is, if the memory cell stored a logic "0", the capacitor is discharged to retain a discharged state. Conversely, if the memory cell stored a logic "1", the capacitor is charged to retain a charged state.

At supply voltage levels substantially higher than the threshold voltages of the devices within the sense amplifier 602, the transistors (P1, P2, N1 and N2) can have a sufficient gate-to-source voltage to quickly drive the bitline pair to complementary values (i.e., bitline high voltage and ground).

However, at lower power supply voltages, sense amplifiers can suffer from performance drawbacks, particularly at lower operating temperatures. One such drawback will now be described in more detail.

Referring still to FIGS. 6 and 7, it will be assumed that an accessed memory cell (e.g., 612-1) stores a logic "0". When sense amplifier 602 tries to amplify a resulting logic "0" signal, n-channel devices (N1 and N2) can have very little overdrive in trying to drive their respective bitlines. In a sense operation, one transistor of each cross-coupled pair can be considered an "on-side" conduction transistor. An on-side conduction n-channel transistor can pull a lower potential bitline (with respect to the other bitline) to ground, while an on-side conduction p-channel transistor can pull the other bitline to a bitline high voltage.

In particular, when a logic "0" data signal is on bitline Blc<0>, bitline Blt<0> will have a higher potential, and provide such a potential to a gate of transistor N2. Thus, transistor N2 is an onside conduction transistor in this case. However, the conduction of onside transistor N2 can be limited as its gate-to-source voltage (Vgs) can be about vbleq, particularly at lower power supply voltages, and voltage vbleq can be scaled according to a power supply voltage. Thus, the overdrive of an on-side conduction transistor can be limited. In this same example, transistor N1 will be an "off-side" conduction transistor. The Vgs of transistor N1 in this case can be the difference between vbleq and the signal on the bitline (i.e., vbleq-signal).

Reduced overdrive in transistors can be exacerbated not only by lower operating voltage, but by lower operating temperature as well.

PSRAM devices, which can include DRAM type sensing schemes like that of FIGS. 6 and 7, can have relatively low operating temperature specifications. As but one example, a PSRAM cold temperature operating specification can be −25° C. to −40° C. At such lower temperature, a threshold voltage (Vt) of an n-channel transistor can increase. As a result, within a sense amplifier, an on-side conduction n-channel device may have a reduced overdrive capability. This can result in an undesirable situation referred to as sense amplifier "stall."

In a sense amplifier stall, a bitline that should be driven to ground at a relatively rapid rate, is driven slower than desired, due to the reduction in overdrive of the on-side n-channel device. A sense amplifier stall is illustrated by portion 700 in FIG. 7. As shown, unlike high-going bitline Blt, which rises at a relatively fast rate to a high bitline voltage VCC, low-going bit line Blc falls a relatively slow rate to ground.

Sense amplifier stall can result in access or functional failures, depending on the severity of the stall.

In light of the above, it would be desirable to arrive at some sense amplifier arrangement and/or control method that would allow for effective amplifier operation at low voltage and/or low temperature conditions.

SUMMARY OF THE INVENTION

The present invention can include a memory device having a first sense supply node driven to a first voltage during a first portion of a sense operation and to a second voltage during a second portion of the sense operation. The second voltage can be a low power supply voltage. The first voltage can be lower in potential than the second voltage. The memory device can also include a sense amplifier circuit that includes a first transistor and second transistor. A first transistor can be of a first conductivity type and have a gate coupled to a first sense node, a source coupled to the first sense supply node, and a drain coupled to a second sense node. A second transistor can be of the first conductivity type and have a gate coupled to the drain of the first transistor, a source coupled to the first sense supply node and a drain coupled to the gate of the first transistor.

In such an arrangement, by driving a sense node to a voltage lower than a low supply voltage, a gate-to-source voltage (Vgs) of sense amplifiers can be increased. As a result, the overdrive capability of such transistors can be increased which can reduce or eliminate sense amplifier stall.

According to one aspect of the embodiments, a second voltage can be ground.

In this way, sense amplifier transistor sources can be driven to a below ground voltage, thus increasing a Vgs of such transistors over conventional arrangements that drive sense transistors to only a ground level during a sense operation.

According to another aspect of the embodiments, a memory device can further include a second sense supply node driven to a third voltage during a sense operation. A third the third voltage can be a high power supply voltage that is greater in potential than the first voltage and the second voltage. A sense amplifier can further include a third transistor and fourth transistor. A third transistor can be of a second conductivity type and have a gate coupled to the first sense node, a source coupled to a second sense supply node, and a drain coupled to the second sense node. A fourth transistor can be of the second conductivity type and have a gate coupled to the drain of the third transistor, a source coupled to the second sense supply node and a drain coupled to the gate of the third transistor.

In this way, a sense amplifier can include two pairs of cross-coupled transistors of complementary conductivity types. One such pair can be driven to a below supply voltage.

According to another aspect of the embodiments, a memory device can further include a first select circuit that couples the first sense node to a first bitline and the second sense node to a second bitline in response to a first select signal. Further, a memory device can include a second select circuit that couples the first sense node to a third bitline and the second sense node to a fourth bitline in response to a second select signal. In this way, one pair of sense nodes can be connected to bitlines of separate arrays or blocks.

According to another aspect of the embodiments, a memory device can further include an equalization circuit. An equalization circuit can provide an equalization voltage to the first sense node and second sense node in an equalization operation. The equalization operation can be different than a sense operation. An equalization voltage can be essentially half way between the low power supply voltage and a high power supply voltage. According to another aspect of the embodiments, an equalization circuit can further include an equalization voltage path that provides a low impedance path between the first sense node and the second sense node in the equalization operation.

In this way, sense nodes may be brought to an equalized potential prior to and/or after a sense operation.

According to another aspect of the embodiments, a memory device can further include a plurality of memory cells coupled to the bitline, each memory cell including a transistor and storage capacitor.

In such an arrangement, a sense amplifier can writeback a low logic value that is lower than a low power supply level (e.g., below ground). This can result in a writeback value that is more robust than conventional arrangements that drive a bitline to a ground level.

According to another aspect of the embodiments, a memory device can further include a first supply circuit that couples the first sense supply node to the first power supply voltage and subsequently couples the first sense supply node to the second power supply voltage in response to a plurality of first control signals.

According to another aspect of the embodiments, a memory device can further include a second supply circuit that couples a second sense supply node to the third power supply voltage.

The present invention may also include a method of controlling a sense amplifier. Such a method can include applying a high set signal to the sense amplifier and applying a low set signal to the sense amplifier. The low set signal can have a first potential that is lower than a ground potential. After applying a low set signal at the first potential, the low set signal can be brought to about the ground potential prior to a precharge operation.

In this way, a sense amplifier can be driven by a low set signal that is lower than ground potential, thereby increasing drive of the devices within. However, by subsequently raising a low set signal to ground level, sense amplifier nodes can be configured for equalization with respect to a ground potential.

According to another aspect of the embodiments, the step of applying the low set signal can include applying such a signal to a plurality of sense amplifiers.

According to another aspect of the embodiments, the step of applying the low set signal can include applying the low set signal to commonly connected sources of two n-channel transistors in each sense amplifier.

In this way, the method can include driving n-channel device with a below ground voltage to increase the Vgs of such devices, and hence their drive capability.

According to another aspect of the embodiments, a method may further include driving a word line to a high drive voltage prior to applying the high set signal and the low set signal. The word line can then be driven to a low drive voltage prior to bringing the low set signal to about the ground potential.

According to another aspect of the embodiments, a method may further include, after driving the word line to the low drive voltage, equalizing a potential between complementary sense nodes of the sense amplifier.

The present invention may also include a sense amplifier control system. Such a system can include a sense amplifier that amplifies a voltage differential according to the application of a high set signal and a low set signal. The system can also include a control circuit that discharges the low set signal substantially below a ground voltage during a sensing operation, and raises the low set signal to about a ground voltage prior to a precharge operation.

According to another aspect of the embodiments, a sense amplifier can include n-channel transistors having commonly connected sources that receive the low set signal.

According to another aspect of the embodiments, such a system can further include a bitline pair coupled to the sense amplifier having bitlines that are driven to complementary bitline voltages in a sense operation according to a sensed data value. The complementary bitline voltages can include a high bitline voltage and low bitline voltage. The system can also include a precharge circuit that places the bitline lines of the bitline pair at about half the high bitline voltage in a precharge operation.

According to another aspect of the embodiments, such a system can include n-channel transistors having commonly connected sources that receive the low set signal.

According to another aspect of the embodiments, such a system can include a first supply circuit that receives the ground voltage and a voltage substantially below the ground voltage and selectively provides such voltages to the sense amplifier in response to select signals.

DETAILED DESCRIPTION

Various embodiments of the present invention will now be described in detail with reference to a number of drawings. The embodiments include a sense amplifier circuit and control method, as well as a memory device containing such a circuit.

Figure 1:
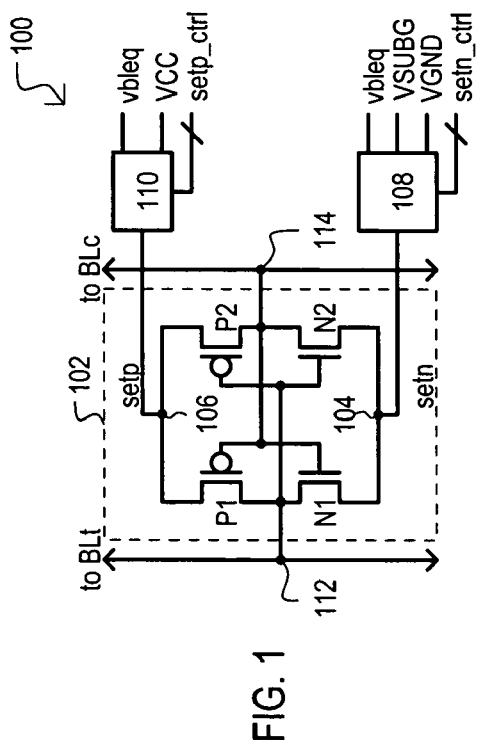
FIG. 1 is a schematic diagram of a sense amplifier arrangement according to one embodiment of the present invention.

A first embodiment of the present invention includes a sense amplifier arrangement and is set forth in FIG. 1 and designated by the general reference character 100. A sense amplifier arrangement 100 can include a sense amplifier 102 that includes a first pair of cross-coupled transistors N1 and N2. Transistors N1 and N2 can be n-channel insulated gate field effect transistors (referred to herein as MOSFETs). Transistors N1 and N2 can have sources that are commonly connected to a first sense supply node 104. First sense supply node 104 can receive a first sense signal setn. Sense amplifier 102 can also include a second pair of cross-coupled transistors P1 and P2. Transistors P1 and P2 can be p-channel MOSFETs. Transistors P1 and P2 can have sources that are commonly connected to a second sense supply node 106. Second sense supply node 106 can receive a second sense signal setp.

Sense signals setn and setp can "set" or "enable" the sense amplifier, and so can be considered "set" signals.

The sense amplifier arrangement 100 can further include a first supply circuit 108 and a second supply circuit 110. A first supply circuit 108 can generate first sense signal setn. However, unlike conventional arrangements, in which a sense signal is driven to a precharge voltage (e.g., vbleq) during a precharge operation, and a low supply voltage (e.g., ground) during a sense operation, in the embodiment of FIG. 1, a first sense signal setn can be driven between two voltages during the same sense operation.

When set (or enabled), a sense amplifier 102 can drive a first sense node 112 and second sense node 114 to complementary potentials (e.g., VCC/VGND or VGND/VCC).

In the very particular example of FIG. 1, first supply circuit 108 can receive a precharge voltage vbleq, a first sense voltage VGND, and a second sense voltage VSUBG. A first sense voltage VGND can be a low power supply, more particularly, ground. A second sense voltage VSUBG can have a potential lower than a low power supply. More particularly, a second sense voltage can be a below ground voltage. The various voltages received by first supply circuit 108 (vbleq, VGND and VSUBG) can be provided as sense signal setn in response to control signals setn_ctrl.

In the very particular example of FIG. 1, second supply circuit 110 can receive a precharge voltage vbleq and a third sense voltage VCC. A third sense voltage VCC can be a high bitline voltage, more particularly a high power supply voltage. The various voltages received by second supply circuit 110 (vbleq and VCC) can be provided as sense signal setp in response to control signals setp_ctrl.

Figure 2:
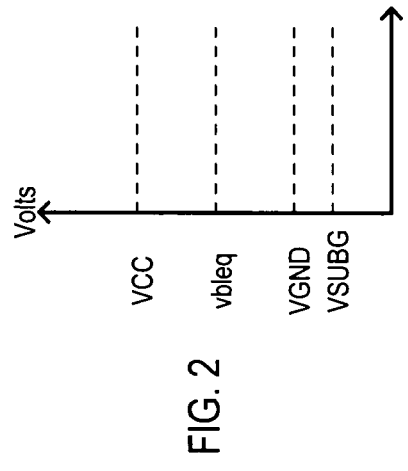
FIG. 2 is a graph showing relative potentials of sense supply voltages shown in FIG. 1.

The relationship between the various sense voltages shown in FIG. 1 is illustrated in FIG. 2. As shown in FIG. 2, a precharge voltage vbleq can be essentially midway between third supply voltage VCC and first supply voltage VGND. In addition, second supply voltage VSUBG is lower in potential than VGND.

Having described the components of a sensing scheme in FIG. 1, the general operation of the sense amplifier arrangement will now be described. In a precharge operation, which can precede/follow a sense operation, a first sense signal setn and second sense signal setp can both be at a precharge voltage vbleq.

In a sense operation, sense amplifier 102 can be set (enabled) by driving first sense signal setn low, and second sense signal setp high. In the particular example of FIG. 1, second sense signal setp can be driven to a third supply voltage VCC. In addition, and unlike conventional arrangements, a second sense signal setn can be driven first to a second supply voltage VSUBG, and then subsequently raised to a higher, but still enabling, first supply voltage VGND.

In one very particular arrangement, according to control signals setn_ctrl, first supply circuit 108 can initially select a precharge voltage vbleq in a precharge operation. Subsequently, in a sense operation, select signals setn_ctrl can first select voltage VSUBG and then select voltage VGND. In addition, according to control signal setp_ctrl, second supply circuit 110 can initially select a precharge voltage vbleq in a precharge operation. Subsequently, in a sense operation, select signal setp_ctrl can select voltage VCC.

Figure 3:
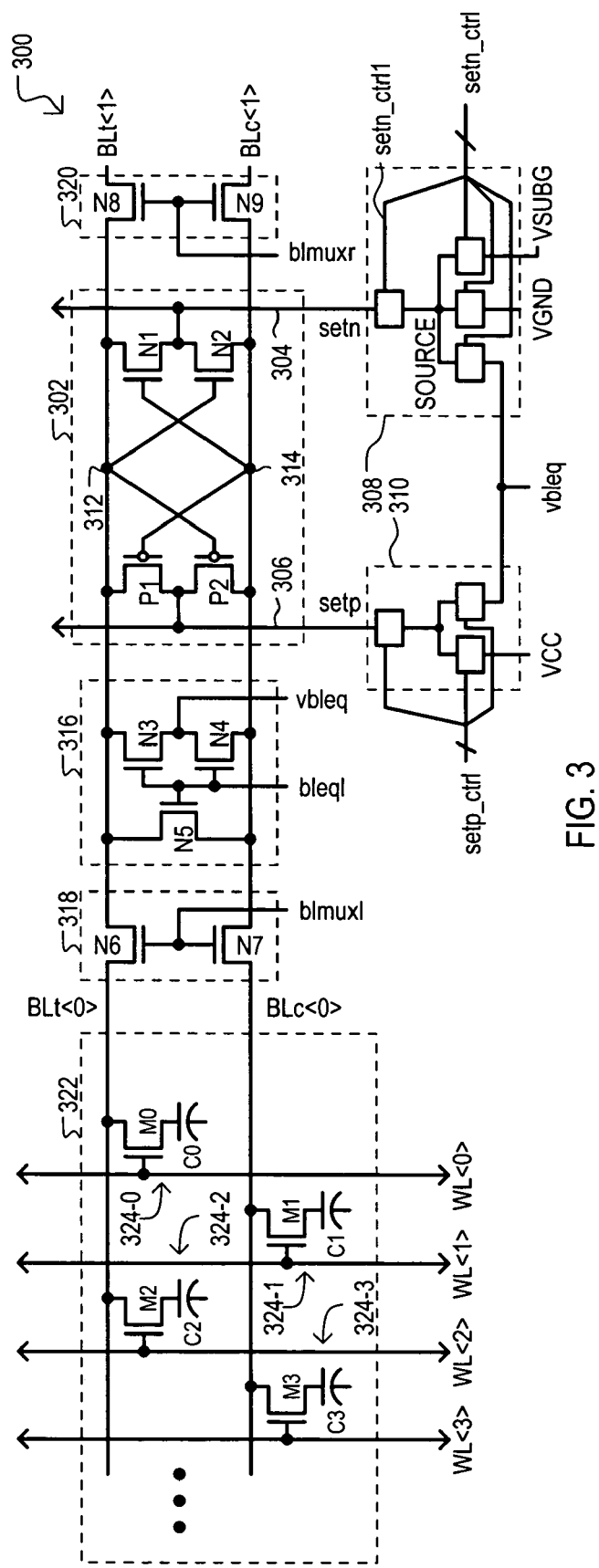
FIG. 3 is a schematic diagram of a memory device according to another embodiment of the present invention.
Figure 4:
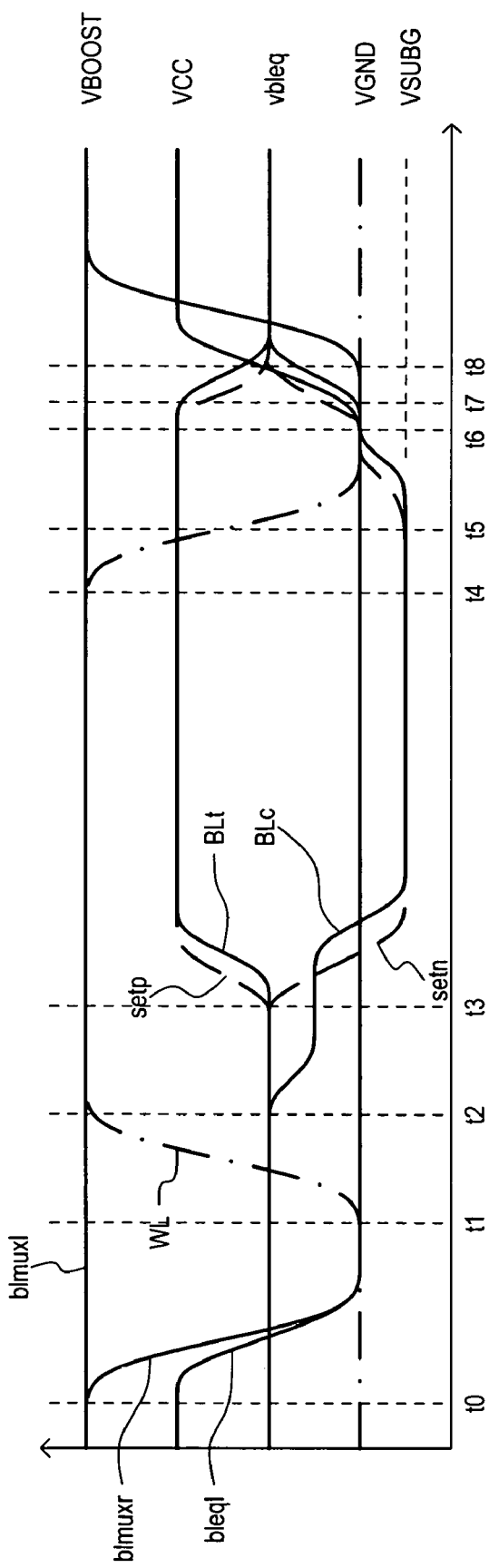
FIG. 4 is a timing diagram showing the operation of the embodiment of FIG. 3.

A second embodiment will now be described with reference to FIGS. 3 and 4. FIG. 3 is a detailed schematic diagram of a memory device according to a second embodiment. FIG. 4 is a timing diagram showing the operation of the device of FIG. 3.

Referring now to FIG. 3, a memory device according to a second embodiment is designated by the general reference character 300. A memory device 300 can include some of the same general constituents as FIG. 1. Accordingly, like sections will be referred to by the same reference character but with the first digit being a "3" instead of a "1".

Referring to FIG. 3, first and second sense signals (setp and setn) are shown extending past sense amplifier 302. This indicates that such signals can be applied to multiple sense amplifiers (not shown) in the same sense or refresh operation.

Referring still to FIG. 3, in addition to a sense amplifier 302 like that of FIG. 1, a memory device 300 can also include an equalization circuit 316, a first select circuit 318, a second select circuit 320, and a memory cell array 322. In an equalization operation, an equalization circuit 316 can equalize a potential between sense nodes 312 and 314. In addition, or alternatively, equalization circuit 316 can provide an equalization voltage vbleq to sense nodes 312 and 314.

In the very particular example of FIG. 3, equalization circuit 316 can include three n-channel transistors N3, N4 and N5. Transistor N3 can have a source-drain path connected between sense node 312 and an equalization voltage vbleq. Transistor N4 can have a source-drain path connected between sense node 314 and an equalization voltage vbleq.

Transistor N5 can have a source-drain path connected between sense nodes 312 and 314. Transistors N3-N5 can have gates that commonly receive an equalization signal bleql. Thus, when equalization signal bleql is high, a potential between sense nodes 312 and 314 can be equalized by transistor N5, and transistors N3 and N4 can provide equalization voltage vbleq to sense nodes 312 and 314, respectively.

A first select circuit 318 can couple a first bitline pair Blt<0> and BLc<0> to sense nodes 312 and 314, respectively. In the very particular example of FIG. 3, first select circuit 318 can include two n-channel transistors N6 and N7. Transistor N6 can have a source-drain path connected between bitline BLt<0> and sense node 312. Transistor N7 can have a source-drain path connected between bitline BLc<0> and sense node 314. Transistors N6 and N7 can have gates that commonly receive a first select (multiplexer) signal bimuxl. In this way, a first select circuit 318 can connect a sense amplifier to a memory cell array 322.

In a similar manner, second select circuit 320 can couple a second bitline pair Blt<1> and BLc<1> to sense nodes 312 and 314, respectively. In the very particular example of FIG. 3, second select circuit 320 can include two n-channel transistors N8 and N9. Transistor N8 can have a source-drain path connected between bitline BLt<1> and sense node 312. Transistor N9 can have a source-drain path connected between bitline BLc<1> and sense node 314. Transistors N8 and N9 can have gates that commonly receive a second select (multiplexer) signal bimuxr. It is understood that second select circuit 320 can connect a sense amplifier 302 to another memory cell array (not shown). In this way, a sense amplifier 302 can be shared between two memory cell arrays.

A memory device 300 can include dynamic storage memory cells, and is preferably a pseudo-static random access memory (PSRAM) device. In the particular example of FIG. 3, memory cell array 322 can include a number of memory cells, four of which are shown as 324-0 to 324-3. Each memory cell (324-0 to 324-3) can include an n-channel transistor M0-M3, respectively, and storage capacitor C0-C3, respectively.

According to the second embodiment 300, a low voltage signal setn can be modulated to provide more overdrive for the on-side conduction n-channel device by increasing a resulting Vgs of such a device. In particular, a source of a sense signal setn driver can be forced to a voltage below ground before a sense amplifier is set or enabled. Thus, when a setn signal is asserted in a sense operation, such a signal can drive a sense amplifier supply node to a value below ground. As will be described in more detail below, a conventional level-shifting type of circuit can be used to generate such a below ground supply level.

The above arrangement, that provides a lower than ground modulation of source voltage, can provide a Vgs sufficiently large to pull the associated low bitline toward the setn level that is below ground. This operation can also write back a more negative "0" signal into the cell, providing more charge in the cell "writeback." Such a writeback can include a cell access (e.g., a cell read) and/or a refresh operation. In this way, according to the present invention, a greater low bitline pulldown effect can help reduce/eliminate sense amplifier stall, and in addition, provide a lower writeback potential than conventional arrangements that only writeback at a ground voltage level.

In a memory device 300, a voltage of sense signal setn can be raised to ground from the below ground level, before setn and setp are precharged to vbleq. It can be preferable to bring setn to about a ground level prior to a precharge operation; so that when sense nodes 312 and 314 are shorted together, charge sharing will result in a voltage that can be equal to about vbleq (which is ½ of the bitline high voltage in this example).

Having described the general construction of a memory device according to a second embodiment, the operation of the memory device will now be described with reference to FIG. 4 in conjunction with FIG. 3.

Referring now to FIG. 4, the operation of the memory device 300 of FIG. 3 will now be described. It will be assumed that memory cell array 322 will be accessed in a read (or refresh) operation. FIG. 4 shows operational waveforms in a timing diagram for the embodiment of FIG. 3. It is understood that a conventional sense amplifier, such as that discussed above with reference to FIG. 6, can be configured to operate according to the waveforms of FIG. 4.

At about time t0, an active cycle can be initiated. An active cycle can begin with a second select signal blmuxr falling from a high voltage level (VBOOST) to a low voltage level (VGND). As a result, transistors N8 and N9 can be turned off within second select circuit 320, thus isolating bitlines (BLt<1> and BLc<1>) from sense amplifier 302. This selection signal (blmuxr) can thus be used to isolate an inactive array block (for example, the right side including BLt<1> and BLc<1>) so that the shared sense amplifier can be used with the active array block.

At about the same time, an equalization signal bleql can fall from an equalization voltage (vbleq) to a low voltage level (VGND). This can turn off transistors N3, N4 and N5 within equalization circuit 316. Thus, equalization circuit 316 can present a high impedance between sense nodes 312 and 314 during a subsequent sense operation.

However, at the same time (about to), a first select signal blmuxl can remain in a high state (at VBOOST) to enable the bitlines of an active array block to be used with a sense amplifier 302. In the particular example of FIG. 4, bitline BLt<0> and BLc<0> can be used with the sense amplifier 302 in the described active cycle. It is noted that first select signal blmuxl can be at a boost voltage that is greater than a high bit line voltage (VCC) to thereby ensure sufficient overdrive in n-channel devices (N6 and N7) within first select circuit 318.

At about time t1, a word line (WL) can be activated by going to a high level (in this case VBOOST) to select associated memory cells. In the particular example of FIG. 3, even-numbered word lines (e.g., WL<0>, WL<2>, etc.) can select cells that share a "true" bitline (e.g., BLt<0>). Odd-numbered word lines (e.g., WL<1>, WL<3>, etc.) can select cells that can share a "complement" bitline (e.g., BLc<0>).

In the very particular example illustrated by FIG. 4, it will be assumed that an activated word line "WL" going high results in a memory cell storing a "low" charge state being coupled to bit line BLc<0>. As a result, a capacitor within a selected memory cell can charge share with the associated bitline (in this case, bit line "BLc<0>") to bring a resulting bitline voltage lower. This can generate a signal to be "sensed" by sense amplifier 302, which is the resulting differential voltage formed between bitlines BLt<0> and BLc<0>.

At time t2, charge sharing resulting from the selection of a memory cell can result in one bitline BLc falling in potential while the other bit line BLt remains at the precharge voltage (vbleq).

At about time t3, a sense operation can begin by setting (or enabling) sense amplifier 302. In particular, sense signals setp and setn, can be driven high and low, respectively. According to the disclosed embodiment, and unlike a conventional arrangement like that of FIG. 6, a sense signal setn can be discharged to a substantially below ground level (VSUBG). As can be appreciated by comparing FIGS. 4 to 7, such an arrangement can reduce if not essentially eliminate a sense amplifier stall condition.

Referring still to FIG. 4, as the sense signals (setn and setp) are driven in the sense operation, bitlines (BLt and BLc) can be driven to complementary values according to the originally developed differential voltage.

Thus, following a time t3, one bit line (in this case BLt) can get charged fully to about the driven voltage level of sense signal setp (in this case VCC). Similarly, the other bitline (in this case BLc) can be discharged to the driven voltage level of sense signal setn (the below ground level, VSUBG). In this way, a sufficient Vgs can be developed on n-channel devices (N1 and N2) within sense amplifier 302 to thereby overcome adverse conditions that could arise from relatively high Vts in such devices.

In addition, by driving a bitline to such a below ground level can result in a more negative logical "0" value to be written back into the memory cell. That is, a memory cell capacitor may charge share with a VSUBG level, as opposed to a ground voltage, as would be the case in the conventional example of FIG. 6.

At about time t4, a selected word line (WL) can be discharged to a low voltage level (VGND), thereby isolating a selected memory cell from a corresponding bitline.

At about time t5, and unlike conventional arrangements like that of FIG. 6, sense signal setn can be driven from the below ground level (VSUBG) to about a ground level (VGND). In this way, a low sense supply can be modulated within a sensing operation. That is, a sense signal (e.g., sense supply) may be initially set to one level (VSUBG) and then subsequently raised to another level (VGND). This is in contrast to a conventional arrangement, like that of FIG. 6, which maintains a low sense supply at a single level throughout a sense operation (e.g., maintained at a ground voltage). As noted above, such an arrangement can help ensure that a subsequent equalization operation results in an equalization voltage that is essentially midway between a high bitline voltage (VCC) and low supply voltage (VGND).

At about time t6, sense signals setn and setp can both return to equalization levels (vbleq). As a result, sense amplifier 302 can be essentially turned off, and will no longer drive bitlines (BLc and BLt) according to a sensed logic value.

At about time t7, an equalization operation can start by an equalization signal bleql can rising from a low level (VGND) to a high level (VCC). As a result, equalization circuit 316 can provide a low impedance path between sense nodes (312 and 314) via transistor N5. In addition, a bitline equalization voltage vbleq can be provided to sense nodes (312 and 314) via transistors N3 and N4. It is noted that at this time first select signal blmuxl can remain high (at VBOOST), thus the equalization operation results in bitlines BLt<0> and BLc<0> being set to an equalization voltage vbleq as well.

In this way, a second embodiment may first drive a sense voltage (setn) to a first low level (VSUBG), and subsequently raise sense voltage to a second low level (VGND). More particularly, a sense voltage (setn) can be raised to a second low level after a word line falls to a deselect value (e.g., from VBOOST to VGND), but prior to an equalization operation (e.g., prior to equalization signal rising from VGND to VCC).

As shown in FIG. 4, an equalization operation can result in bit lines (BLt and BLc) being set to an equalization potential (vbleq) at about time t8.

Figure 5:
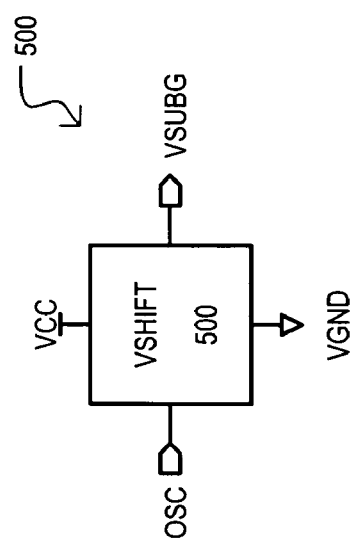
FIG. 5 is a block schematic diagram of a voltage shift circuit that can be utilized in conjunction with the embodiments.

Referring now to FIG. 5, one example of a level shifting circuit is set forth in FIG. 5 and designated by the general reference character 500. A level shifting circuit 500 may generate a low sense voltage (VSUBG) that is lower in potential than a low supply voltage (VGND). A level shifting circuit 500 can include a charge pump type circuit that operates according to an oscillator signal OSC. However, the present invention should not be limited to such an arrangement. As but one of the many possible alternate arrangements, a memory device can include a "self-booting" arrangement, in which a sense node is pushed below ground according to a one or more timing signal.

Figure 6:
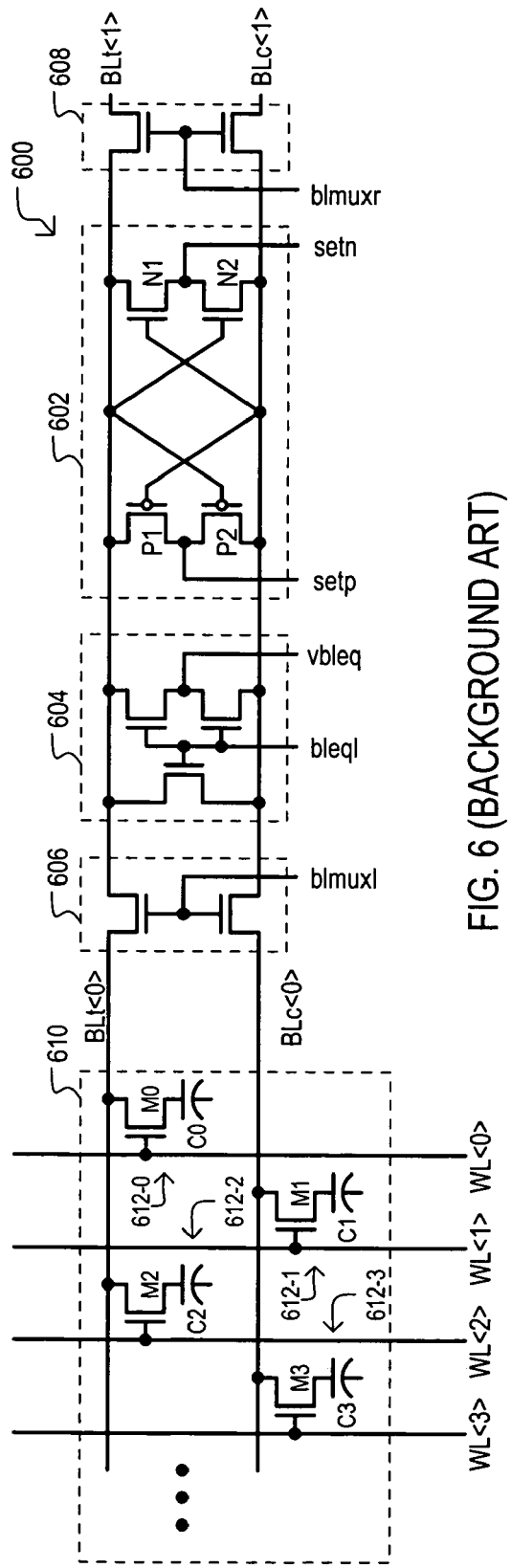
FIG. 6 is a schematic diagram of a conventional memory device.
Figure 7:
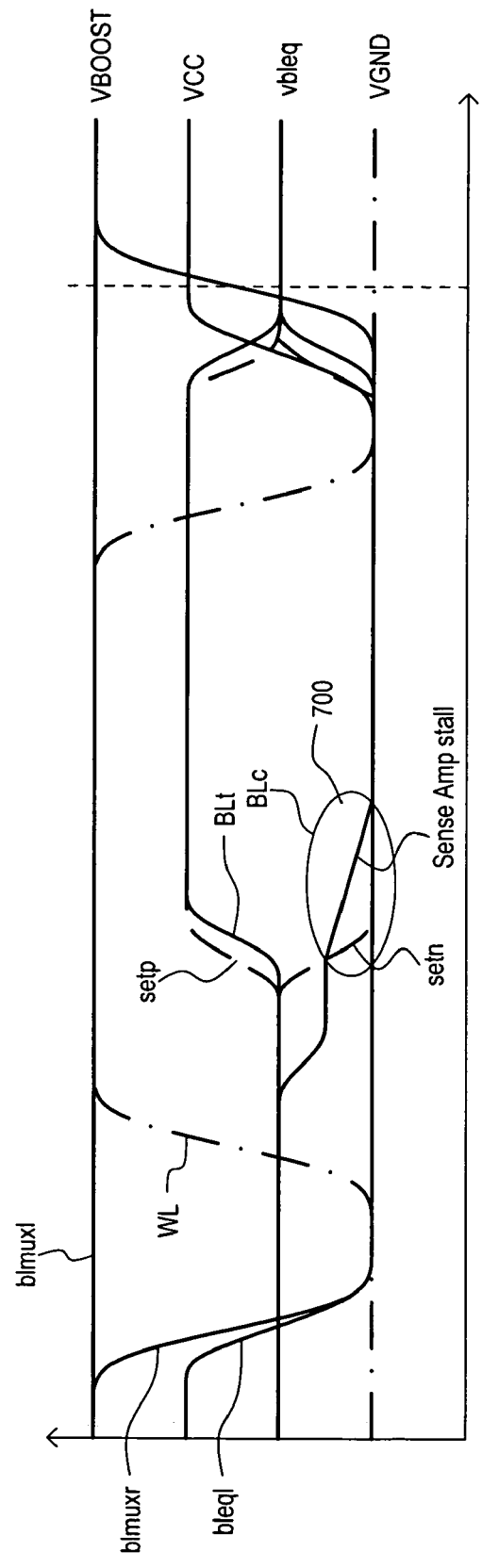
FIG. 7 is a timing diagram showing the operation of the embodiment of FIG. 6.

An advantage of the approach shown in the various embodiments over a conventional approach, like that of FIG. 6, can be that an operating range of a sense amplifier can be extended for low power, low voltage and/or low temperature applications. In particular, this approach can be used for memory device applications where the low temperature specification is in about the −25° C. to −40° C. range.

It is understood that the embodiments of the invention may be practiced in the absence of an element and or step not specifically disclosed. That is, an inventive feature of the invention can be elimination of an element or step.

Still further, it is noted that a high bitline voltage (e.g., VCC) of the embodiments, may be a power supply voltage applied to an external pin of a packaged memory device. However, a high bitline voltage should not necessarily be limited to such an arrangement. A high bitline voltage may be a voltage that is "stepped" down from a high power supply voltage provided to a memory device, such as a regulated internal high supply voltage.

Similarly, a low supply voltage (VGND) of the embodiments can be a ground voltage applied to an external pin of a semiconductor device. However, such a voltage should not necessarily be limited to such an arrangement. A low supply voltage may be a voltage that is "stepped" up from a low power supply voltage provided to a memory device, such as a regulated internal low supply voltage.

Accordingly, while the various aspects of the particular embodiments set forth herein have been described in detail, the present invention could be subject to various changes, substitutions, and alterations without departing from the spirit and scope of the invention.

What is claimed is:

1. A memory device, comprising:
a first sense supply node driven to a first voltage during a first portion of a sense operation and to a second voltage during a second portion of the sense operation, the second voltage being a low power supply voltage, the first voltage being lower in potential than the second voltage;
a sense amplifier circuit, comprising
a first transistor of a first conductivity type having a gate coupled to a first sense node, a source coupled to the first sense supply node, and a drain coupled to a second sense node, and
a second transistor of the first conductivity type having a gate coupled to the drain of the first transistor, a source coupled to the first sense supply node and a drain coupled to the gate of the first transistor; and
a first supply circuit that couples the first sense supply node to a first voltage power supply and subsequently couples the first sense supply node to a second voltage power supply in response to a plurality of first control signals.

2. The memory device of claim 1, wherein:
the second voltage is ground.

3. The memory device of claim 1, further including:
a second sense supply node driven to a third voltage during the sense operation, the third voltage being a high power supply voltage that is greater in potential than the first voltage and the second voltage; and
the sense amplifier circuit further comprises
a third transistor of a second conductivity type having a gate coupled to the first sense node, a source coupled to a second sense supply node, and a drain coupled to the second sense node, and
a fourth transistor of the second conductivity type having a gate coupled to the drain of the third transistor, a source coupled to the second sense supply node and a drain coupled to the gate of the third transistor.

4. The memory device of claim 1, further including:
a first select circuit that couples the first sense node to a first bitline and the second sense node to a second bitline in response to a first select signal.

5. The memory device of claim 4, further including:
a second select circuit that couples the first sense node to a third bitline and the second sense node to a fourth bitline in response to a second select signal.

6. The memory device of claim 1, further including:
an equalization circuit comprising precharge impedance paths that provide an equalization voltage to the first sense node and second sense node in an equalization operation different from the sense operation, the equalization voltage being essentially half way between the low power supply voltage and a high power supply voltage.

7. The memory device of claim 6, wherein:
the equalization circuit further comprises an equalization impedance path that provides a low impedance path between the first sense node and the second sense node in the equalization operation.

8. The memory device of claim 1, further including:
a plurality of memory cells coupled to the bitline, each memory cell including a transistor and storage capacitor.

9. The memory device of claim 1, further including:
a second sense supply node driven to a third voltage during the sense operation, the third voltage being a high power supply voltage that is greater in potential than the first voltage and the second voltage; and
a second supply circuit that couples the second sense supply node to the third power supply voltage.

10. A method of controlling a sense amplifier, comprising the steps of:
applying a high set signal to the sense amplifier;
applying a low set signal to the sense amplifier having a first potential that is lower than a ground potential; and
after applying the first potential low set signal, bringing and maintaining the low set signal to about the ground potential prior to a precharge operation;
driving a word line to a high drive voltage prior to applying the high set signal and the low set signal; and
driving the word line to a low drive voltage prior to bringing the low set signal to about the ground potential.

11. The method of claim 10, wherein:
applying the low set signal includes applying the low set signal to a plurality of sense amplifiers.

12. The method of claim 11, wherein:
the step of applying the low set signal includes applying the low set signal to commonly connected sources of two n-channel transistors in each sense amplifier.

13. The method of claim 10, further including:
after driving the word line to the low drive voltage, equalizing a potential between complementary sense nodes of the sense amplifier.

14. A sense amplifier control system, comprising:
a sense amplifier that amplifies a voltage differential according to the application of a high set signal and a low set signal and a word line being activated; and
a control circuit that discharges the low set signal to substantially below a ground voltage during a sensing operation and raises and maintains the low set signal to about a ground voltage prior to a precharge operation and after the word line is deactivated.

15. The sense amplifier control system of claim 14, wherein:
the sense amplifier includes n-channel transistors having commonly connected sources that receive the low set signal.

16. The sense amplifier control system of claim 14, further including:
a bit line pair coupled to the sense amplifier having bitlines that are driven to a complementary bitline voltages in a sense operation according to a sensed data value, the complementary bitline voltages including a high bitline voltage and low bitline voltage; and
a precharge circuit that places the bitline lines of the bitline pair at about half the high bitline voltage in the precharge operation.

17. The sense amplifier control system of claim 14, wherein:
the sense amplifier includes p-channel transistors having commonly connected sources that receive the high set signal.

18. The sense amplifier control system of claim 14, further including:
a first supply circuit that receives the ground voltage and a voltage substantially below the ground voltage and selectively provides such voltages to the sense amplifier in response to select signals.

* * * * *

UNITED STATES PATENT AND TRADEMARK OFFICE
CERTIFICATE OF CORRECTION

PATENT NO. : 7,313,041 B1 Page 1 of 1
APPLICATION NO. : 10/870289
DATED : December 25, 2007
INVENTOR(S) : David Chapman and Richard Parent It is certified that error appears in the above-identified patent and that said Letters Patent is hereby corrected as shown below:

At column 9, line 36, please replace "to" with -- t0 -- so that the corresponding phrase reads -- (about t0) --.

Signed and Sealed this

Twenty-seventh Day of May, 2008

JON W. DUDAS
*Director of the United States Patent and Trademark Office*